United States Patent [19]

Ohkubo et al.

[11] Patent Number: 4,909,742

[45] Date of Patent: Mar. 20, 1990

[54] IC CARD AND MATING SOCKET

[75] Inventors: Isao Ohkubo, Kawasake; Shintaro Aiba, Kanagawa, both of Japan

[73] Assignee: ITT Corporation, New York, N.Y.

[21] Appl. No.: 296,175

[22] Filed: Jan. 12, 1989

Related U.S. Application Data

[62] Division of Ser. No. 3,668, Jan. 15, 1987, abandoned.

[30] Foreign Application Priority Data

Jan. 20, 1986 [JP] Japan .................................. 61-8090

[51] Int. Cl.$^4$ .............................................. H01R 23/70
[52] U.S. Cl. ..................................... 439/59; 439/633; 361/399
[58] Field of Search ................................ 439/59–62, 439/76, 260, 263, 264, 267, 630–637; 361/393, 394, 395, 399, 413

[56] References Cited

U.S. PATENT DOCUMENTS

| | | | |
|---|---|---|---|
| 2,857,577 | 10/1958 | Vanderpool | 439/59 |
| 3,022,481 | 2/1962 | Stepoway | 439/260 |
| 3,567,998 | 3/1971 | Ammerman | 361/399 |
| 3,657,805 | 4/1972 | Johnson | 29/589 |
| 3,912,353 | 10/1975 | Kasuya et al. | 339/75 |
| 4,017,696 | 4/1977 | Falk | 179/175 |
| 4,149,027 | 4/1979 | Asher et al. | 174/52 |
| 4,226,491 | 10/1980 | Kazama et al. | 339/17 |
| 4,264,114 | 4/1981 | Chandler | 339/17 |
| 4,379,606 | 4/1983 | Clark et al. | 339/17 |
| 4,380,360 | 4/1983 | Parmer et al. | 439/59 |
| 4,409,641 | 4/1981 | Jakob et al. | 361/386 |
| 4,494,143 | 1/1985 | Lovick et al. | 439/260 |
| 4,525,802 | 6/1985 | Hackamack | 364/900 |
| 4,530,553 | 7/1985 | Aujla | 439/260 |
| 4,531,176 | 7/1985 | Beecher, II | 361/424 |
| 4,539,472 | 9/1985 | Poetker et al. | 235/488 |
| 4,565,922 | 1/1986 | Anderson | 235/492 |
| 4,568,133 | 2/1986 | Amano et al. | 339/14 |
| 4,591,950 | 5/1986 | Houpt | 361/399 |
| 4,598,962 | 7/1986 | Reitz et al. | 339/17 |
| 4,675,516 | 6/1987 | Guion | 235/441 |
| 4,682,017 | 7/1987 | Nakahara et al. | 235/492 |
| 4,695,925 | 9/1987 | Kodai et al. | 361/395 |
| 4,701,830 | 10/1987 | Kato et al. | 361/395 |
| 4,776,803 | 10/1988 | Pretchel et al. | 439/59 |
| 4,780,603 | 10/1988 | Hamada | 361/413 |
| 4,780,791 | 10/1988 | Morita et al. | 361/395 |
| 4,781,612 | 11/1988 | Thrush | 439/328 |
| 4,790,761 | 12/1988 | Sonobe | 439/59 |
| 4,808,115 | 2/1989 | Norton et al. | 439/248 |

FOREIGN PATENT DOCUMENTS

| | | |
|---|---|---|
| 0270065 | 11/1987 | European Pat. Off. . |
| 1143559 | 6/1961 | Fed. Rep. of Germany . |
| 2016485 | 10/1971 | Fed. Rep. of Germany . |
| 2310610 | 9/1974 | Fed. Rep. of Germany . |
| 2459307 | 6/1976 | Fed. Rep. of Germany . |
| 2558975 | 1/1985 | France . |
| 60-129895 | 7/1985 | Japan . |
| 60-129896 | 7/1985 | Japan . |
| 60-153583 | 8/1985 | Japan . |
| 60-209883 | 10/1985 | Japan . |
| 60-209886 | 10/1985 | Japan . |
| 60-236250 | 11/1985 | Japan . |
| 61-86885 | 5/1986 | Japan . |
| 61-153790 | 7/1986 | Japan . |
| 2156552 | 10/1985 | United Kingdom . |

OTHER PUBLICATIONS

Patent Abstracts of Japan, vol. 8, No. 271 (p. 320), Dec. 12, 1984; & JP-A-59 140 591 (Sony, K.K.) 8/11/84.
Nachrichten Elektronik+ Telematik, vol. 39, No. 4, Apr. 1985, pp. 137–140, Heidelberg, DE; "Von der Substratfolie zur Chipkarte", pp. 137–138.

*Primary Examiner*—Neil Abrams
*Attorney, Agent, or Firm*—Thomas L. Peterson

[57] ABSTRACT

A credit card type small thin rectangular IC Card has a battery and an IC comprising a CPU, a ROM and a RAM mounted on a flexible printed circuit and bonded within an insulative plastic material. The printed circuit of the card has a plurality of electrode terminals exposed in a parallel array along at least one edge of the card which are adapted to engage contacts of a mating socket. The printed circuit terminals are manufactured by coating copper, nickel and gold over polyamide resin and squeeze finishing the leading edge. The mating socket comprises a general U-shaped frame having a U-shaped channel adapted to receive the IC card and having internal recessed contacts adapted to engage the terminals of the IC card. The contacts extend from an exterior surface of the frame for interconnection with the circuits of a mating device. Downwardly projecting portions thereof are bent at least twice in the portion penetrating the bottom of the frame.

1 Claim, 6 Drawing Sheets

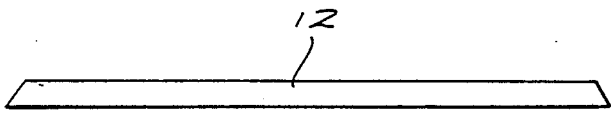
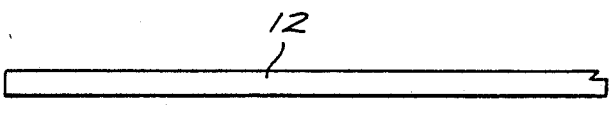
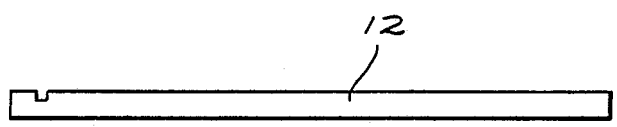
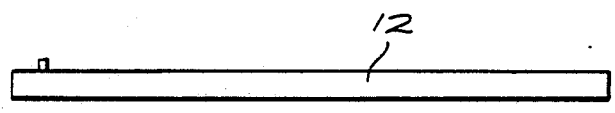
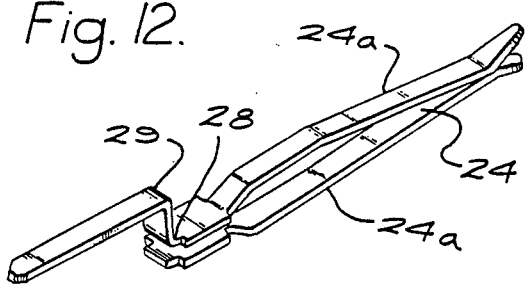

IC CARD AND MATING SOCKET

This is a division of copending application Ser. No. 003,668 filed Jan. 15, 1987, now abandoned.

BACKGROUND OF THE INVENTION

This invention related to IC cards and mating sockets of free insertion and withdrawl capability. In the prior art it is commonly known that information memory cards magnetically store information and are being used between banking and other facilities and their customers. The card of this type, the so called magnetic card, is convenient in its own use and is considered to be the only kind of memory card for this application. However the greatest weak point of this type of card is that the amount of information that can be stored thereon is very limited. Also it can furnish information only in response to requirements from outside equipment and does not have logical and calculating functions of its own. In order to eliminate these problems the IC card of the present invention was devised. The present invention also solves interfacing problems by providing an interconnection structure which is inexpensive and can be manufactured in small sizes on thin type cards which contain units such as a battery, a memory, a central processing unit, switches, etc., both active and passive elements. The purpose of this invention is to furnish an IC card and mating socket which is small and thin sized and free from the various weaknesses described above and to facilitate interconnection between the IC card and mating socket.

SUMMARY OF THE INVENTION

In order to solve the above problems, this invention includes a flexible board with wiring printed on it as necessary. On a side of the flexible board at least the necessary number of terminals are placed perpendicular to the side and parallel with each other for connecting this board to an outside mating device. The terminals are separated from each other with insulating material. On the board, passive and active circuit parts, the battery, etc. are mounted as necessary. Both surfaces of the board are coated with synthetic resin insulating material by means of insulation molding, the upper and lower areas of the terminals being left uncoated.

Furthermore, in order to connect the terminals of the card to an outer device, a socket is provided having a U-shaped frame of insulating material with a U-shaped channel in the middle part of the inside of the frame and having plural contacts made of metal secured in the bottom part of the frame in parallel and separate array, the spaces between the contacts being covered by insulating material of the frame. The contacts project downwardly out of the bottom of the frame. The ends of the contacts projecting upwardly toward the U-shaped channel should be at the same level or somewhat lower than the brim of the channel.

Since the card of this invention is manufactured simply by molding those active/passive elements and other necessary parts on a flexible printed board it is easy to produce and suitable for mass production at low cost. Further because of solid molding the card can be thinned down to a thickness of less than one millimeter. The connection to outer devices through the socket provided insures proper mating.

BRIEF DESCRIPTION OF THE DRAWINGS

In the accompanying drawings which illustrate an exemplary embodiment of the present invention:

FIGS. 7a and 7b and 8a and 8b are top views of four versions of the IC card with edges or projections for polarizing the card, FIG. 12 is an enlarged view of the socket contact.

DESCRIPTION OF THE PREFERRED EMBODIMENT

Figure 1:
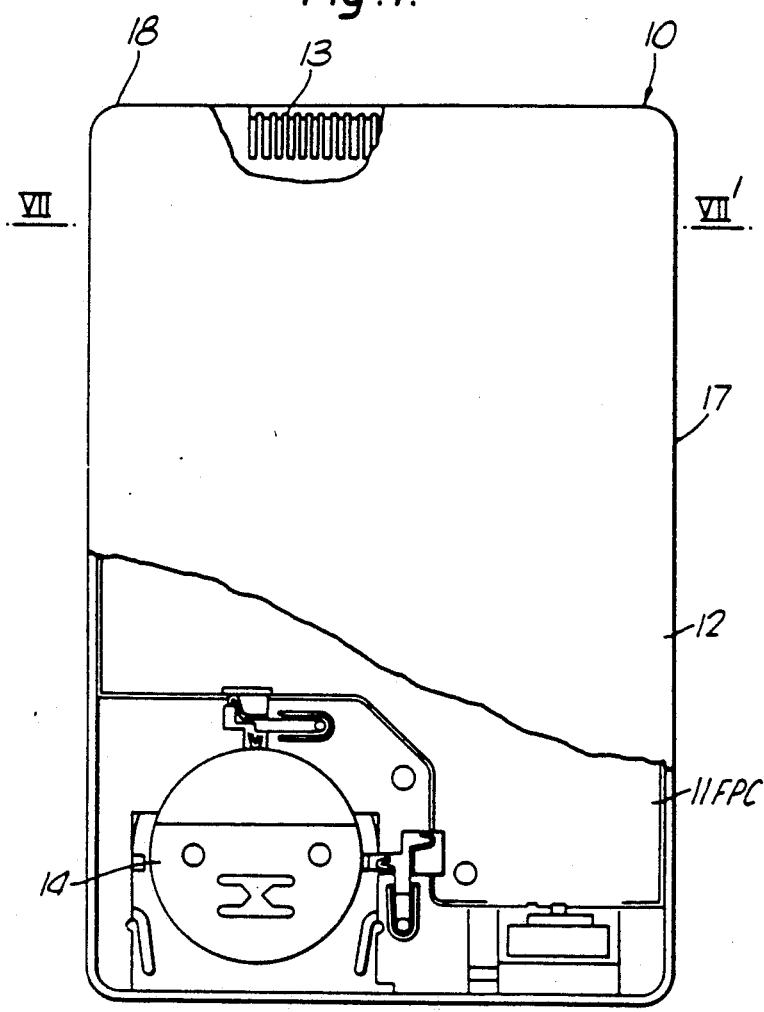
FIG. 1 is an elevation view of the IC card.

Referring to FIG. 1, there is illustrated therein the IC card 10 of this invention, having a flexible printed circuit board 11 on both sides of which are installed a CPU 15 a RAM 15' and a ROM 15" with a battery 14 connected by a suitable method. On one side at least of the flexible printed circuit board 11 of FIG. 2 there is connecting conductor coating which connects individual circuit parts, a battery and terminals 13 as mentioned later. These connections are not shown in detail in the figure.

Figure 2:
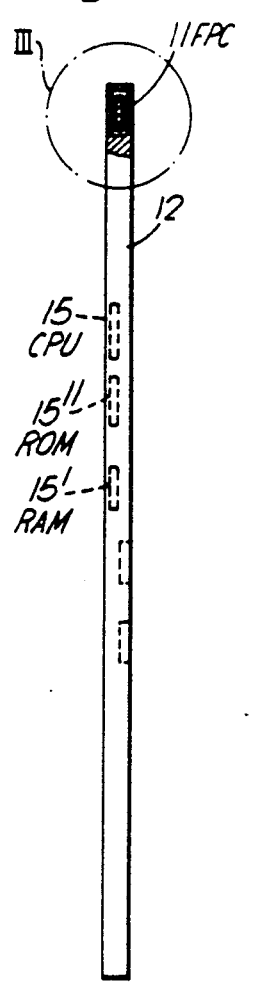
FIG. 2 is a side view of the IC card.
Figure 3:
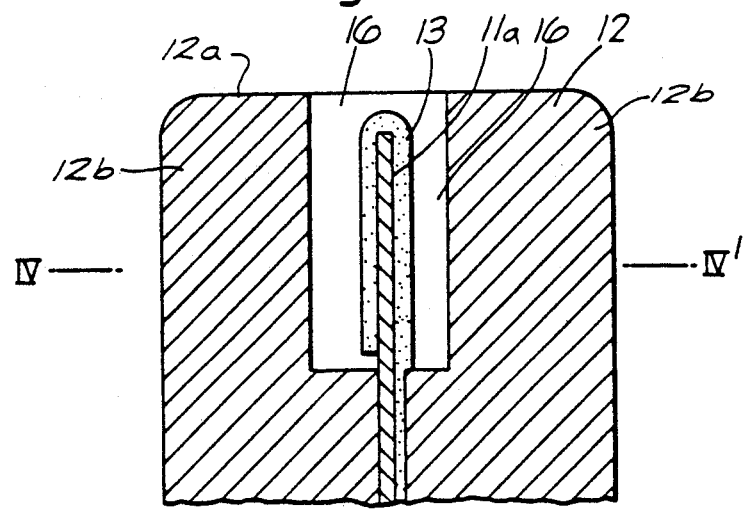
FIG. 3 is an enlarged view of the encircled part III of FIG. 2.
Figure 4:
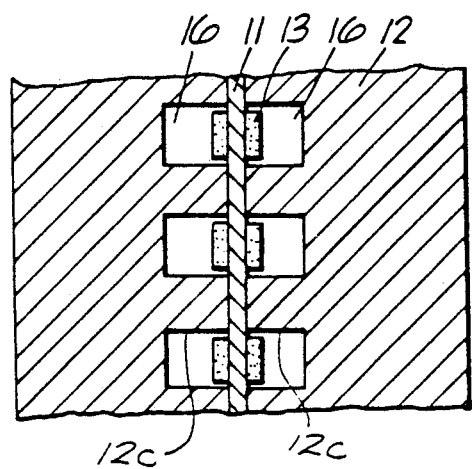
FIG. 4 is a sectional drawing along the line IV—IV' of FIG. 3.
Figure 5A:
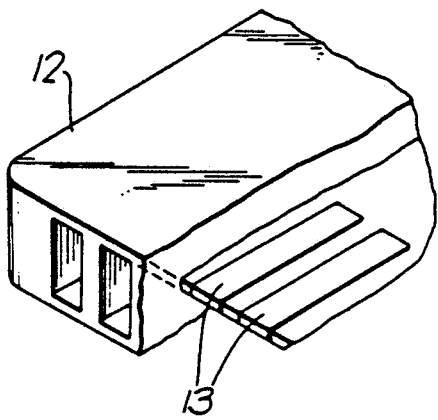
FIG. 5a is an enlarged view of the IC card terminal.
Figure 5B:
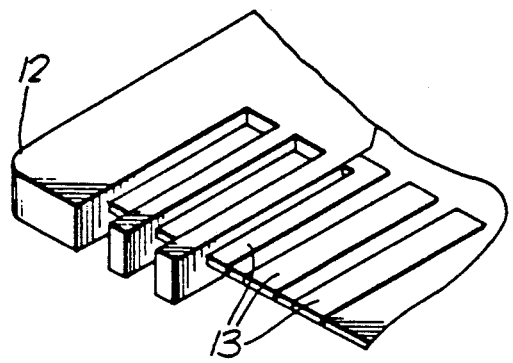
FIG. 5b is a view of the terminal in the width of one millimeter.

The bulk of both surfaces and sides of the circuit board unit thus assembled is covered and coated by an insulating material 12 forming the card housing. FIG. 2 illustrates a cross section when the completed card was cut in parallel with the longer sides. The encircled portion III in FIG. 2, a part of the IC card, is enlarged in FIG. 3. The border 11a of the printed circuit board on which the terminals 13 are formed extends into a slot 16 that opens at the edge 12a of the card housing 12. The slot 16 defines spaced sidewalls 12b, each spaced from the printed circuit board 11. On both sides of the board 11 the terminals 13 are shown. Further the terminals 13 which are each in parallel array are spaced from each other by housing separation walls 12c as shown in FIG. 4 which is a cross section cut along the lines of IV to IV' of FIG. 3. This structure is used to decrease the force on the terminals and to prevent deformation of the card terminals and the flexible printed circuit when the IC card has been inserted into the socket as mentioned later. The terminals 13 may be installed on only one side of the flexible printed circuit but it is more desirable to install them on both sides by folding over the upper end of the terminals as shown in FIGS. 3 and 4. Thus contacts of the mating socket (to be described later) on both sides of the terminals insure highly reliable mating and nondirectional insertion of the card. (See FIGS. 5a and 5b.)

Figure 6A:
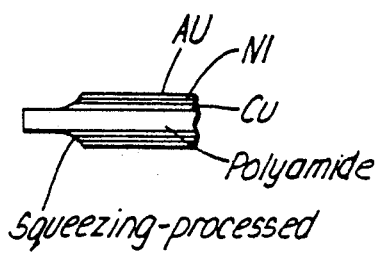
FIGS. 6a and 6b are sectional drawings of the flexible circuit terminal.
Figure 6B:
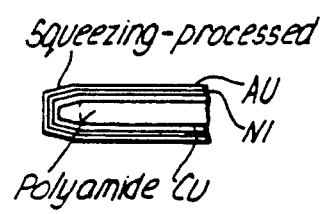

The terminal 13 is made of conductive material, desirably from metal, and squeezing finishing is preferable. This contributes to long life and together with the easy zero insertion force method assures mating and unmating of over ten thousand cycles. The flexible printed circuit terminals are manufactured by coating copper, nickel and gold in this order over a polyamide resin, for example, as shown in FIGS. 6a and 6b. In the example illustrated these terminals are seen only along a shorter side of a rectangular IC card. However they are not to be limited to a side but can be installed on two shorter sides for example or on suitable positions in plural groups along four sides.

Though in the above example, the IC cards shown are rectangular any other configuration may be used as necessary. In the case of the above example of IC cards the two sides 17 and 18 perpendicular to the side containing terminals 13 are desirable to be non revolvable when viewed from the side on extending lines of those two sides. For example, when FIG. 1 was cut along the line VII—VII' the configurations of cross sections should preferably by like FIGS. 7a and 7b. The forms of 7a and 7b are very effective for preventing wrong insertion of the card into the socket by polarizing the card. Instead of the above mentioned asymmetry formed by the two sides a river channel may be made along a line somewhat inside of one side of the card as shown in FIGS. 8a and 8b while making a mating rib on the socket.

Figure 11:
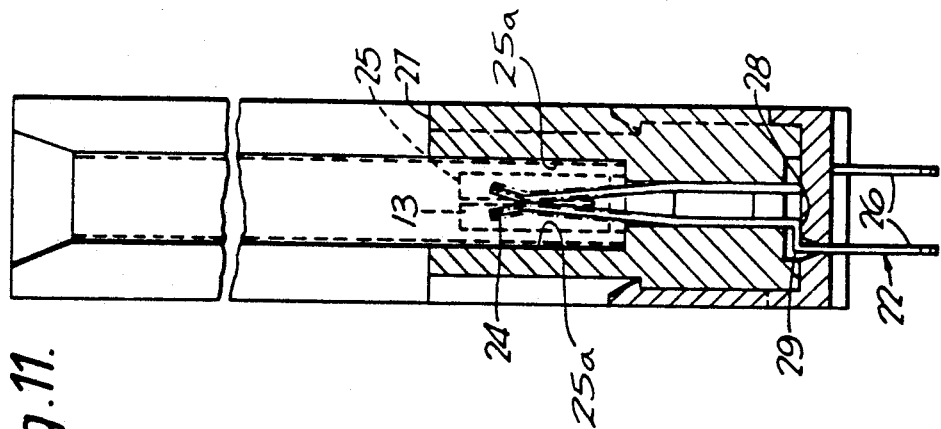
FIG. 11 is a sectional drawing along the lines IX—IX' of FIG. 10.
Figure 9:
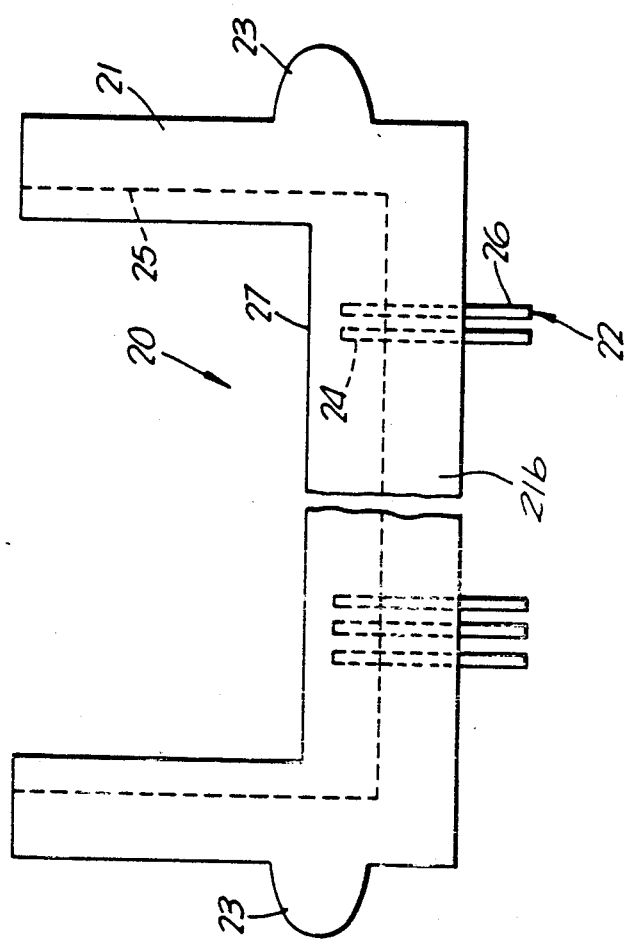

A card of this type can be connected as is to outside devices through the terminals 13. It however has so many terminals, for example some 20 pieces, that the pitch or space between the two terminals is limited, for example to 1.27 millimeters. It is rather difficult for various reasons to install corresponding contacts on the outside device. Therefore it is desirable to provide a socket through which the IC card can be connected to an outside device. Turning to FIG. 9, this figure shows the socket 20 of the invention which consists an outer frame 21 in U shape made from insulating material, preferably plastic and contacts 22 which penetrate the bottom part of the frame perpendicularly. The frame may be installed with two lugs 23, one on each side. Inside of the frame 21 are provided a channel 25 in U shape for receiving the IC card and containing contacts 22 whose upper ends 24 engage the terminals on the card. The position of the channel 25 is in the middle of the U-shaped frame in the direction of thickness as shown in FIG. 11. The sides 25a of the channel are parallel to each other and extend to the upper surface 27 of the bottom 21b of the frame. The contact 22 consists of a lower terminal 26 which projects out of the bottom of the frame and the upper interconnecting terminal 24 which extends from the lower terminal 26 upwards and penetrates through the bottom into the channel 25. The interconnecting terminal 24 comprises two spring arms 24a for holding a card terminal therebetween. The interconnecting terminals 24 of the contacts are spaced from the sides 25a of the channel 25 providing open regions which receive the sidewalls 12b of the card when the card is mounted in the socket as seen in FIG. 11. The edge 12a of the card abuts the bottom of channel 25 so that the terminals 13 and contacts 22 are protected from the environment.

Figure 10:
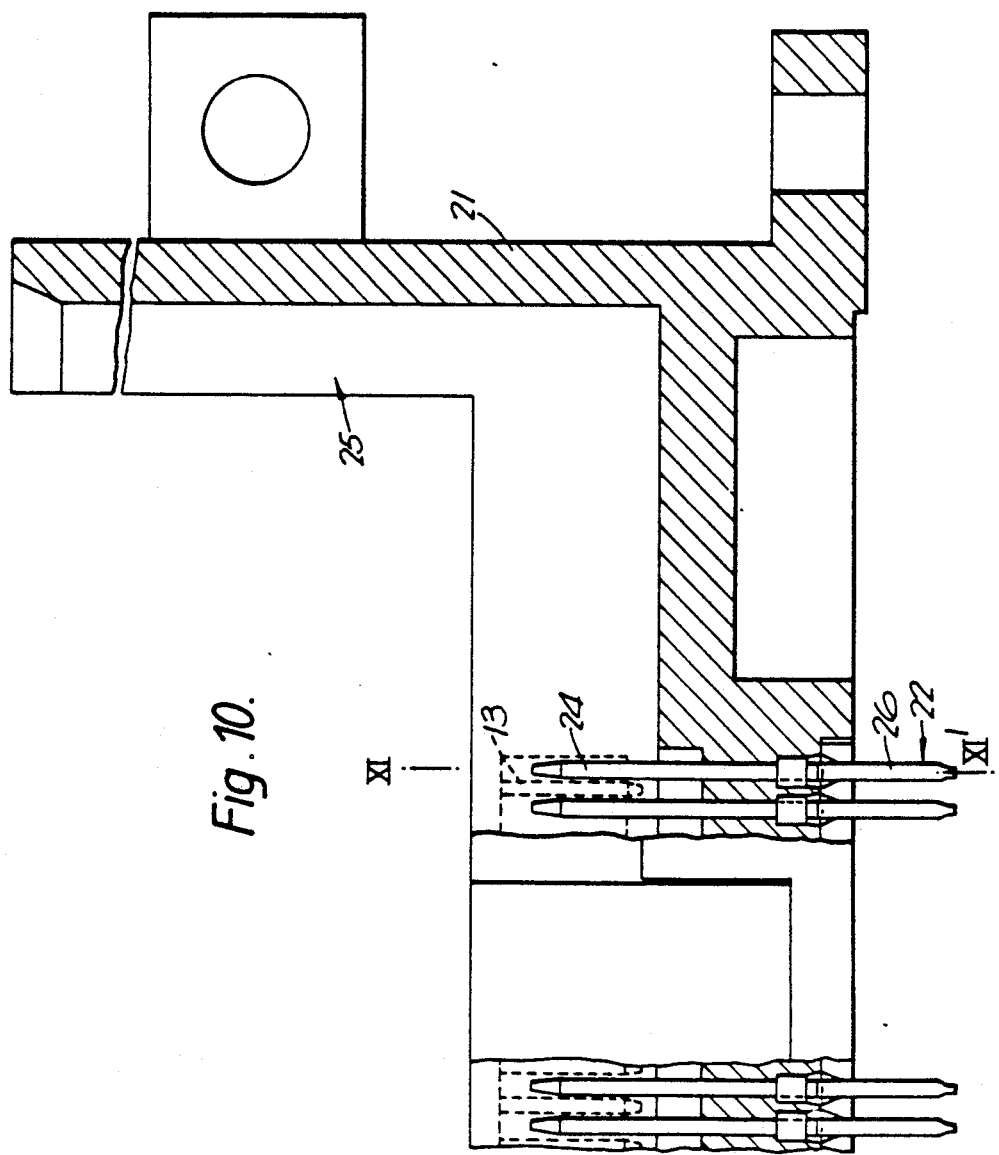
FIG. 10 is an enlarged partial view of the mating socket for the IC card.

The socket can be fabricated by first arraying a required number of contacts 22 in a mold and then by injecting plastic, for example, into the mold. The upper end 24 of the contact is desirably flush with or somewhat lower than the upper surface or brim 27 of the U shaped channel 25 on the bottom as shown in FIG. 10 and 11. Thus fabricated the IC card may be guided through the channel 25 and its terminals 13 contact the interconnecting terminals 24 of the socket 20 completing the required connection.

The forms of the channel 25 on the right and left sides of the U-shaped frame may be of different mating types for accomodating the sides of the IC card as shown in FIGS. 7a and 7b or may be provided with a rib or indented groove on one side to mate with the card as shown in FIGS. 8a and 8b. By means such as this polarization is provided and wrongful insertion of the card can be avoided.

The interconnecting terminal 24 of the contact when contacted with either side of the terminal 13 on the card makes connection but this tends to load bending strength on the terminals of the IC card and then on the flexible printed circuit card which is undesirable. To avoid this it is desirable to insert two pieces of contact 22 into the body of the frame as shown in FIGS. 11 and 12 so that they can hold the terminal 13 therebetween. Contact 22 is subjected to repetitions of pushing and pulling load in every insertion and withdrawal between the card and the socket. During these repetitions the contact if in the form of a straight line is liable to fall off. In order to avoid this it is desirable to bend the contact, preferably right angled at least twice such as at 28 and 29 in the portion penetrating the frame shown in FIGS. 11 and 12. For practical mating with an outside device it is convenient if every lower end 26 of contacts 22 is installed in zig zag array while the interconnecting terminals 24 are arrayed on a single plane. To that end it is desirable to bend twice leftwards, for example, the pins of odd numbers counted from one end and those of even numbers twice rightward as shown in FIG. 11.

Based on the structures provided above the IC card can be manufactured in a thickness less than one millemeter or can be freely bent if proper types of reinforcement are provided. In addition to the possible functions mentioned above elimination of wrong card insertions into the socket and provision of rugged sockets can be achieved.

Since the principles of the invention have now been made clear, modifications which are particularly adapted for specific situations without departing from those principles will be apparent to those skilled in the art. The appended claims are intended to cover such modifications, as well as the subject matter described and to only be limited by the true spirit of the invention.

What is claimed is:

1. An IC card-socket combination comprising:
   (a) an IC card comprising:
   (i) a flat, relatively thin housing having an elongated edge along a side of said housing;
   (ii) a shallow slot formed lengthwise in said edge forming a pair of spaced sidewalls;
   (iii) a printed circuit member fixedly mounted within said housing, generally aligned with said slot;
   (iv) at least one active device mounted on said printed circuit member within said housing;
   (v) said printed circuit member having a border region extending into said slot spaced equally from said sidewalls, said border region providing an edge and upper and lower surfaces;
   (vi) a row of spaced terminals on at least one of said surfaces of said printed circuit member; and
   (vii) said card housing embodying spaced separation walls extending from said sidewalls to said upper and lower surfaces of said border region of said printed circuit member to support said border region, said separation walls being located between said terminals on said printed circuit member;

(b) said socket comprising:
(i) an insulator having an upper surface and a lower surface, an elongated channel in said insulator opening at said upper surface, and adapted to slidably receive therein said side of said card with said elongated edge adjacent to the bottom of said channel;
(ii) a row of contacts mounted in said insulator having interconnecting terminals spaced apart a distance corresponding to the spacing of said terminals on said printed circuit member and extending upwardly into said channel and said slot for engaging said printed circuit member terminals;
(iii) said interconnecting terminals being recessed within said channel and spaced from the sides of said channel leaving open, unobstructed regions therebetween;
(iv) said card sidewalls being disposed in said open regions when said side of said card is mounted in said channel; and
(v) said spaced separation walls of said card housing forming cavities therebetween, each adapted to receive therein a corresponding one of said interconnecting terminals of said socket.

* * * * *